(12) United States Patent
Khemka et al.

(10) Patent No.: US 9,196,680 B1
(45) Date of Patent: Nov. 24, 2015

(54) METAL OXIDE SEMICONDUCTOR FIELD EFFECT TRANSISTOR WITH REDUCED SURFACE FIELD FOLDING

(71) Applicant: Maxim Integrated Products, Inc., San Jose, CA (US)

(72) Inventors: Vishnu Khemka, Phoenix, AZ (US); Ronghua Zhu, Chandler, AZ (US); Tahir Arif Khan, Gilbert, AZ (US); Vijay Parthasarathy, Sunnyvale, CA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 0 days.

(21) Appl. No.: 14/312,882

(22) Filed: Jun. 24, 2014

Related U.S. Application Data

(60) Provisional application No. 61/922,951, filed on Jan. 2, 2014.

(51) Int. Cl.
*H01L 29/735* (2006.01)
*H01L 29/06* (2006.01)
*H01L 29/78* (2006.01)
*H01L 29/32* (2006.01)

(52) U.S. Cl.
CPC .............. *H01L 29/063* (2013.01); *H01L 29/32* (2013.01); *H01L 29/7833* (2013.01)

(58) Field of Classification Search
USPC ......................................................... 257/336
See application file for complete search history.

(56) References Cited

U.S. PATENT DOCUMENTS 6,979,875 B2 * 12/2005 Kwon et al. .................. 257/492

* cited by examiner

*Primary Examiner* — Matthew W Such
*Assistant Examiner* — Robert Carpenter

(57) ABSTRACT

A laterally diffused metal oxide semiconductor field effect transistor (LDMOSFET) includes: a source contact region, a gate contact region, a drain contact region, and an n-type buried layer. The LDMOSFET also includes a p-type body region formed in an n-type epitaxial layer, the p-type body region directly contacting the source contact region and extending past an end of the source contact region toward the drain contact region. The LDMOSFET also includes a p-type reduced surface field (PRSF) region formed in the n-type epitaxial layer, the PRSF region disposed between the p-type body region and the n-type buried layer. The LDMOSFET also includes an n-type drift region formed in the n-type epitaxial layer, the n-type drift region directly contacting the drain contact region. The LDMOSFET also includes an n-type diffusion region in the n-type epitaxial layer, the n-type diffusion region electrically connecting the n-type buried layer with the n-type drift region.

18 Claims, 4 Drawing Sheets

METAL OXIDE SEMICONDUCTOR FIELD EFFECT TRANSISTOR WITH REDUCED SURFACE FIELD FOLDING

CROSS-REFERENCE TO RELATED APPLICATIONS

This application claims the benefit of U.S. Provisional Application No. 61/922,951, filed on Jan. 2, 2014. The disclosure of the application referenced above is incorporated herein by reference in its entirety.

This application is related to U.S. patent application Ser. No. 14/312,910, which is filed on the came day as this Jun. 24, 2014 and which claims the benefit of U.S. Provisional Application No. 61/922,957, filed on Jan. 2, 2014. The disclosures of the above applications are incorporated herein by reference in their entirety.

FIELD

The present disclosure relates to metal oxide semiconductor field effect transistors (MOSFETs) and more particularly to diffused MOSFETs.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Switching devices are used in a variety of contexts and technology areas. Metal oxide semiconductor, field effect transistors (MOSFETs) are one kind of switching device. A MOSFET generally includes a body, a source, a gate, and a drain. A voltage difference between the body and gate forms a conducting channel between the source and drain.

Various types of MOSFETs are available, such as enhancement type MOSFETs and depletion type MOSFETs, including both p-type enhancement MOSFETs, n-type enhancement MOSFETS, p-type depletion MOSFETs, and n-type depletion MOSFETs. Various types of diffused MOSFETs are also available, such as double diffused MOSFETS (DMOS) and laterally diffused MOSFETS (LDMOSFET).

SUMMARY

A laterally diffused metal oxide semiconductor field effect transistor (LDMOSFET) is disclosed. The LDMOSFET includes: a source contact region, a gate contact region, a drain contact region, and an n-type buried layer. The LDMOSFET also includes a p-type body region formed in an n-type epitaxial layer, the p-type body region directly contacting the source contact region and extending past an end of the source contact region toward the drain contact region. The LDMOSFET also includes a p-type reduced surface field (PRSF) region formed in the n-type epitaxial layer, the PRSF region disposed between the p-type body region and the n-type buried layer. The LDMOSFET also includes an n-type drift region formed in the n-type epitaxial layer, the n-type drift region directly contacting the drain contact region. The LDMOSFET also includes an n-type diffusion region in the n-type epitaxial layer, the n-type diffusion region electrically connecting the n-type buried layer with the n-type drift region.

In other features, the PRSF region extends past an end of the p-type body region and toward the n-type drift region.

In still other features, the PRSF region extends past the end of the p-type body region and past an end of the n-type drift region.

In yet other features, the p-type body region is formed in the n-type epitaxial layer by at least one of ion implantation and diffusion.

In other features, a doping concentration of the p-type body region is between $1e^{17}$ and $5e^{18}$ ions per cubic centimeter, inclusive.

In still other features, the n-type buried layer is formed in the n-type epitaxial layer by at least one of ion implantation and diffusion.

In yet other features, a doping concentration of the n-type buried layer is between $1e^{18}$ and $5e^{19}$ ions per cubic centimeter, inclusive.

In other features, the PRSF region is formed in the n-type epitaxial layer by at least one of ion implantation and diffusion.

In still other features, a doping concentration of the PRSF region is between $5e^{15}$ and $5e^{16}$ ions per cubic centimeter, inclusive.

In yet other features, the n-type drift region is formed in the n-type epitaxial layer by at least one of ion implantation and diffusion.

In other features, a doping concentration of the n-type drift region is between $1e^{16}$ and $1e^{17}$ ions per cubic centimeter, inclusive.

In still other features, a doping concentration of the n-type epitaxial layer is between $1e^{15}$ and $2e^{16}$ ions per cubic centimeter, inclusive.

In yet other features, a distance between an end of the p-type body region and an end of the n-type buried layer is less than 5 microns.

In other features, a distance between an end of the p-type body region and an end of the n-type buried layer is less than 4 microns.

In still other features, a distance between an end of the p-type body region and an end of the n-type buried layer is less than 3 microns.

In yet other features, a distance between an end of the p-type body region and an end of the n-type buried layer is less than 2.5 microns.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

N-type high-side laterally diffused metal oxide semiconductor field effect transistors (LDMOSFETs) include an n-type epitaxial layer, an n-type buried layer (NBL), and a p-type body portion. An LDMOSFET also includes a p-type reduced surface field (PRSF) portion that is located between the p-type body portion and the NBL. The NBL may be connected to a potential at a drain of an LDMOSFET by an external connection.

A thickness of the LDMOSFET between the NBL and the p-type body portion may be small. For example, the distance between the NBL and the p-type body portion may be 5 microns or less in some LDMOSFETs. As such, a breakdown voltage of the LDMOSFET between the p-type body portion and the NBL may be small. A maximum operating voltage of the LDMOSFET may therefore also be small.

According to the present disclosure, an n-type diffusion portion may be implemented in the area between an n-type drift portion connected to the drain and the NBL. The external connection of the potential at the drain to the NBL may be omitted. The n-type diffusion portion electrically links the n-type drift portion with the NBL. The potential at the NBL lags the potential at the n-type drift portion as charge is distributed within the n-type diffusion portion. This increases the breakdown voltage and the maximum operating voltage of the LDMOSFET.

Figure 1:
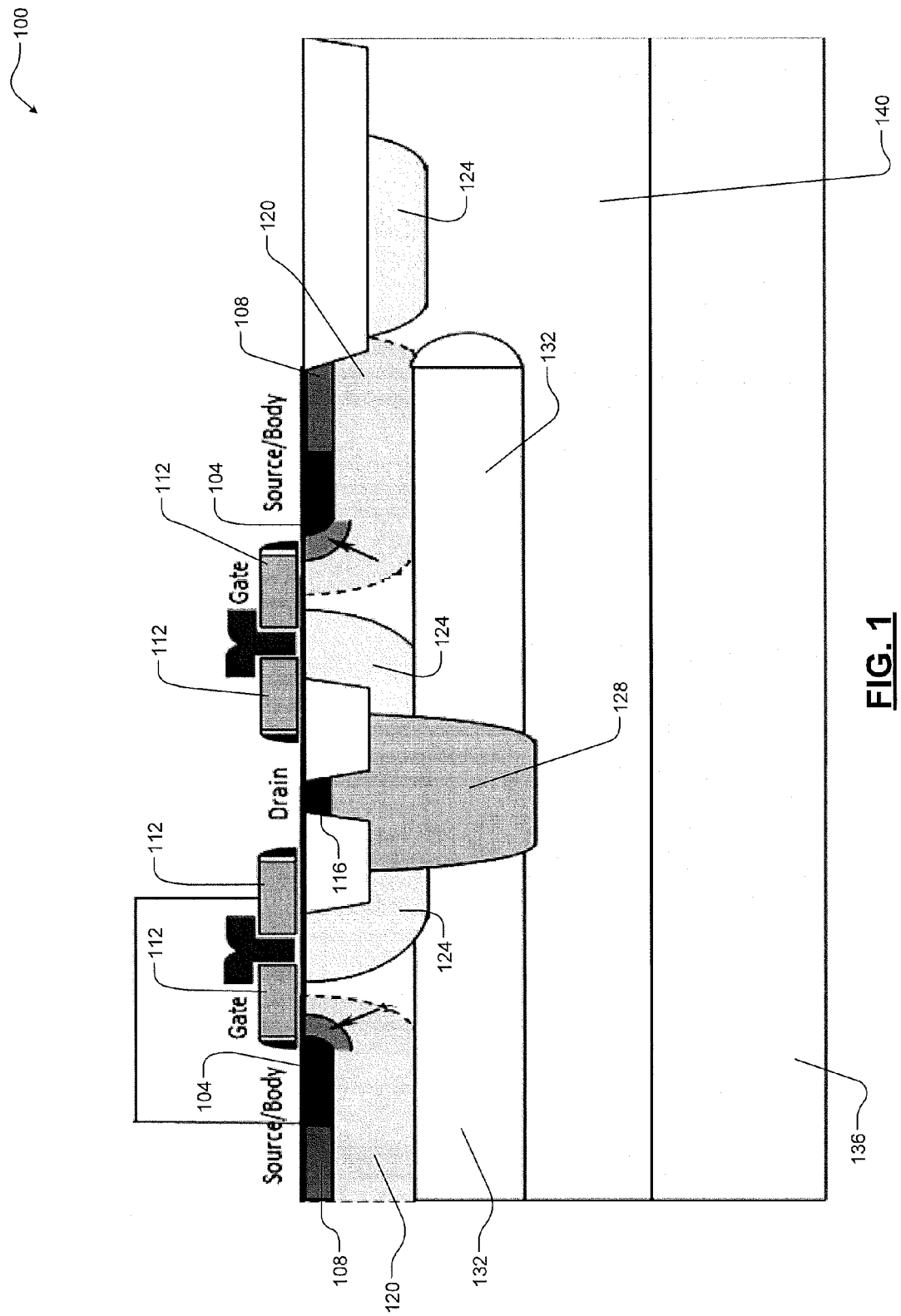
FIG. 1 is a cross-sectional view of an example low-side laterally diffused metal oxide semiconductor field effect transistor (LDMOSFET)

Referring now to FIG. 1, a cross-sectional view of an example low-side laterally diffused metal oxide semiconductor field effect transistor (LDMOSFET) 100 is presented. The LDMOSFET 100 includes source, body, gate, and drain contact regions 104, 108, 112, and 116, respectively. The gate contact region 112 may be electrically connected to the source contact region 104 or the body contact region 108 as shown. The arrangement of the source, body, gate, and drain contact regions 104, 108, 112, and 116 causes lateral current flow in LDMOSFETs.

The LDMOSFET 100 includes p-type body regions 120 formed under the source and body contact regions 104 and 108, respectively. The LDMOSFET 100 also includes n-type drift regions 124 and an n-type drift region 128. The LDMOSFET 100 includes p-type reduced surface field (PRSF) regions 132 located between the p-type body regions 120 and a p-type body layer 136. The n-type drift region 128 may be formed through the PRSF regions 132 to electrically connect the drain contact region 116 with an n-type epitaxial layer 140.

Low-side LDMOSFETs are different than high-side LDMOSFETs in that high-side LDMOSFETs include an n-type buried layer that is electrically connected to a reference potential, such as the drain contact region 116. Low-side LDMOSFETs do not include one or more n-type buried layers.

Figure 2:
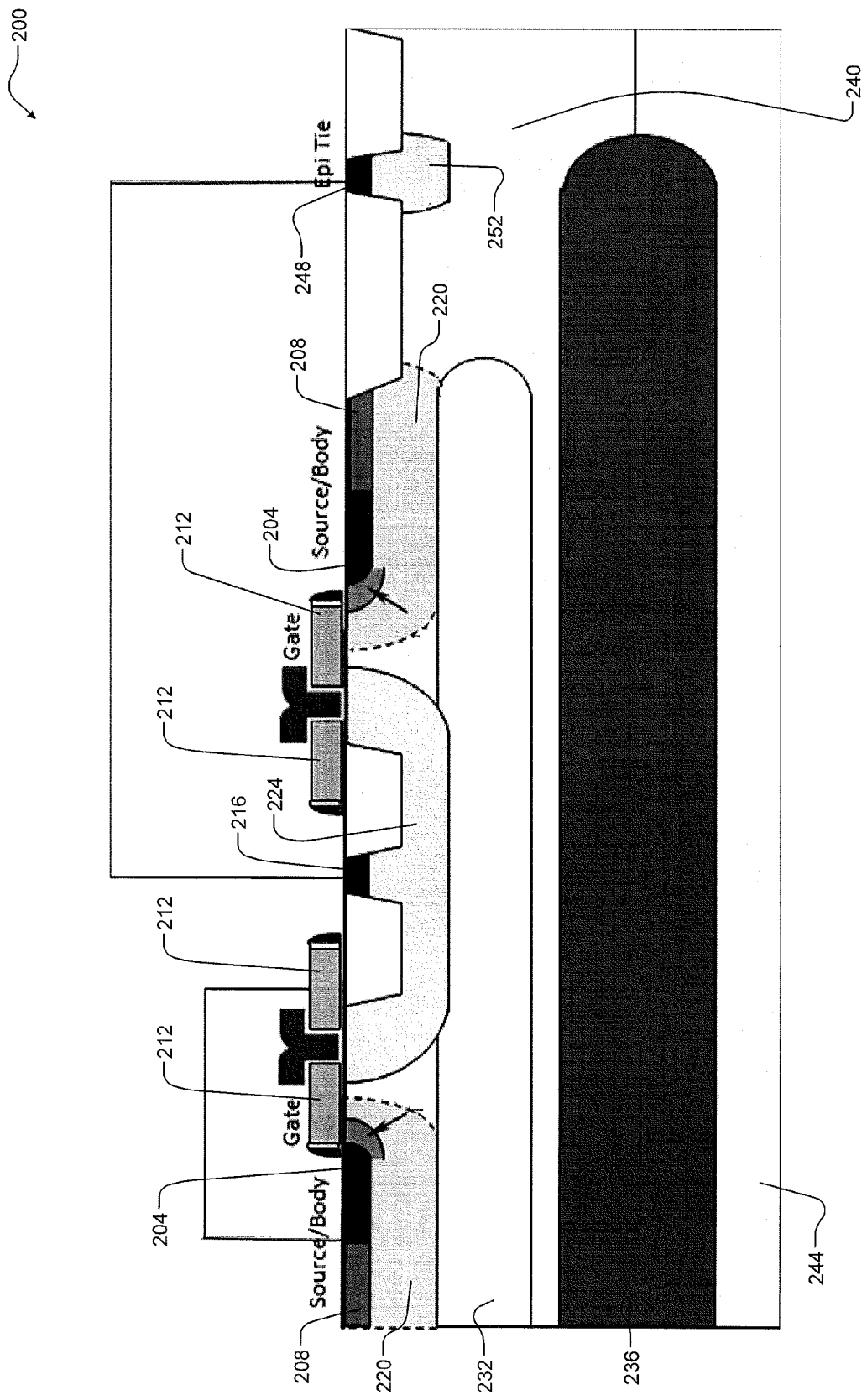
FIGS. 2 and 3 are cross-sectional views of example high-side LDMOSFETs.

FIG. 2 includes a cross-sectional view of an example high-side LDMOSFET 200. Referring now to FIG. 2, the LDMOSFET 200 includes source, body, gate, and drain contact regions 204, 208, 212, and 216, respectively. The gate contact region 212 may be electrically connected to the source contact region 204 or the body contact region 208 as shown. The LDMOSFET 200 includes p-type body regions 220 formed under the source and body contact regions 204 and 208, respectively.

The LDMOSFET 200 includes an n-type drift region 224. The LDMOSFET 200 includes a p-type reduced surface field (PRSF) region 232. The LDMOSFET 200 also includes an n-type buried layer (NBL) 236 and an n-type epitaxial layer 240. The LDMOSFET 200 includes a p-type body layer 244.

The NBL 236 is electrically connected to the drain contact region 216 to electrically connect the NBL 236 to the reference potential at the drain contact region 216. For example, the LDMOSFET 200 may include an epitaxial contact region 248 and an n-type region 252 that electrically connects the drain contact region 216 with the NBL 236 via the n-type epitaxial layer 240.

The material located between the p-type body regions 220 and the NBL 236 serves as an insulator between the p-type body regions 220 and the NBL 236. However, the amount of material located between the p-type body regions 220 and the NBL 236 may be small. For example, the thickness of the n-type epitaxial layer 240 lying above a top portion of the NBL 236 less than 5 microns (um), less than 4 um, less than 3 um, less than 2.5 um, or approximately 2 um or less in various implementations.

The thickness of the n-type epitaxial layer 240 that lies above the top surface of the NBL 236 limits the breakdown voltage of the LDMOSFET 200. As such, a maximum operating voltage (MOV) of the LDMOSFET 200 is also limited. For example only, a LDMOSFET where the thickness of the n-type epitaxial layer 240 that lies above the top surface of the NBL 236 of approximately 2 um may have a breakdown voltage of approximately 30 Volts (V) and a MOV of approximately 20 V.

Figure 3:
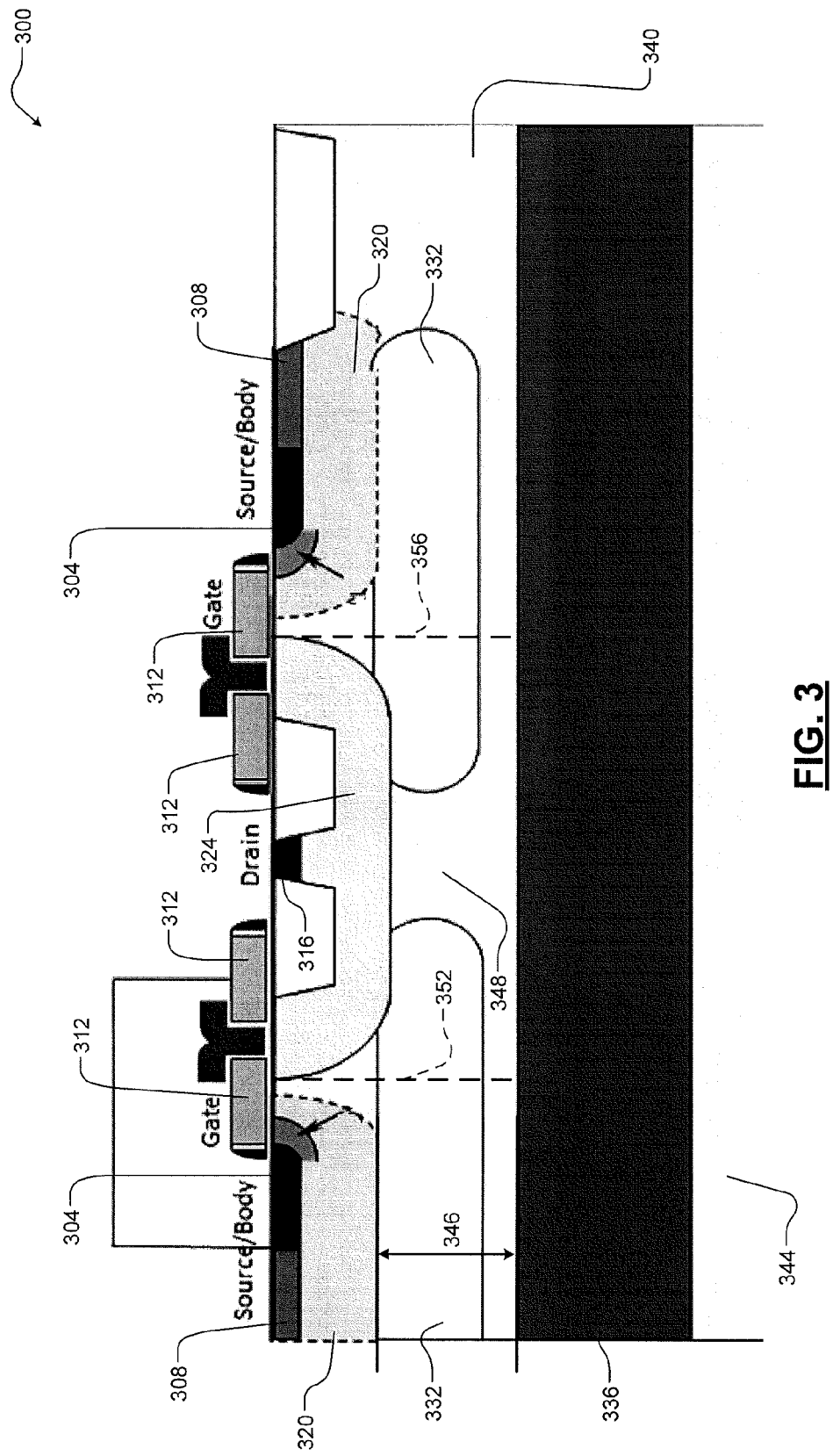

FIG. 3 includes a cross-sectional view of an example n-type high-side LDMOSFET 300. Referring now to FIG. 3, the LDMOSFET 300 includes source, body, gate, and drain contact regions 304, 308, 312, and 316, respectively. A gate contact region may be electrically connected to a source contact region or a body contact region as shown. In various implementations, the gate contact region(s) may not be connected to a source contact region or a body contact region. The source, body, gate, and drain contact regions 304, 308, 312, and 316, respectively, are heavily doped relative to other portions of the LDMOSFET 300. The source, body, gate, and drain contact regions 304, 308, 312, and 316, respectively, may be formed, for example, by ion implantation or in another suitable manner.

The LDMOSFET 300 includes p-type body regions 320 formed under the source and body contact regions 304 and 308, respectively. The p-type body regions 320 may be formed by, for example, ion implantation and/or diffusion. The LDMOSFET 300 includes an n-type drift region 324. The n-type drift region 324 may be formed, for example, by ion implantation and/or diffusion.

The LDMOSFET 300 includes one or more p-type reduced surface field (PRSF) regions 332. The PRSF regions 332 may be formed by ion implantation and/or diffusion. The LDMOSFET 300 also includes an n-type buried layer (NBL) 336 and an n-type epitaxial layer 340. The NBL 336 may be formed, for example, by ion implantation and/or diffusion. The LDMOSFET 300 includes a p-type body layer 344. A thickness 346 of the LDMOSFET 300 between a top portion of the NBL 236 and a bottom portion of the p-type body regions 320 less than 5 microns (urn), less than 4 urn, less than 3 urn, less than 2.5 um, or approximately 2 um or less in various implementations Doping of the p-type body regions 320 may be, for example, approximately $1e^{17}$-$5e^{18}$ ions per cubic centimeter or another suitable doping concentration. Doping of the n-type drift region 324 may be, for example, approximately $1e^{16}$-$1e^{17}$ ions per cubic centimeter or another suitable doping concentration. Doping of the PRSF regions 332 may be, for example, approximately $5e^{15}$-$5e^{16}$ ions per cubic centimeter or another suitable doping concentration. The NBL 336 may be heavily doped, for example, to approximately $1e^{18}$-$5e^{19}$ ions per cubic centimeter or another suitable doping concentration. Doping of the n-type epitaxial layer 340 may be, for example, approximately $1e^{15}$-$2e^{16}$ ions per cubic centimeter or another suitable doping concentration.

Unlike the LDMOSFET 200, the reference potential at the drain contact region 316 of the LDMOSFET 300 is not connected to the NBL 336 by way of an external electrical connection. The LDMOSFET 300 includes an n-type diffusion region 348 that electrically connects the n-type drift region 324 and the NBL 336.

The n-type diffusion region 348 may be part of the n-type epitaxial layer 340 (and therefore have the same doping concentration as the n-type epitaxial layer 340) or an n-type region formed in the n-type epitaxial layer 340 (e.g., by ion implantation and/or diffusion). The n-type diffusion region 348 provides an electrical link between the n-type drift region 324 and the NBL 336, in the area between the PRSF regions 332.

The presence of the n-type diffusion region 348 below the drain contact region 316 enables the reduced surface field action provided by the PRSF regions 332 to be folded from the lateral direction to the vertical direction. More specifically, the n-type diffusion region 348 allows the potential at the drain contact region 316 to be distributed more vertically, toward the NBL 336.

The potential at the NBL 336 lags the potential at the drain contact region 316 via the n-type diffusion region 348. The potential at the drain contact region 316 can therefore be increased relative to the potential at the drain contact region 216 of the LDMOSFET 200. The breakdown voltage (between the p-type body regions 320 and the NBL 336) of the LDMOSFET 300 is therefore greater than the breakdown voltage of the LDMOSFET 200. The MOV of the LDMOSFET 300 is therefore also greater than the MOV of the LDMOSFET 200.

Dimensions of the n-type diffusion region 348 may affect the breakdown voltage of the LDMOSFET 300. For example, the breakdown voltage may decrease as the distance between the PRSF regions 332 in the area between the n-type drift region 324 and the NBL 336 decrease, and vice versa. While the PRSF regions 332 is shown as extending partially into the area directly between the n-type drift region 324 and the NBL 336, the PRSF regions 332 may end outside of that area directly between the n-type drift region 324 and the NBL 336 in various implementations. In FIG. 3, the area directly between the n-type drift region 324 and the NBL 336 is defined by lines 352 and 356. The PRSF regions 332 may terminate before extending into the area between the lines 352 and 356.

Figure 5:
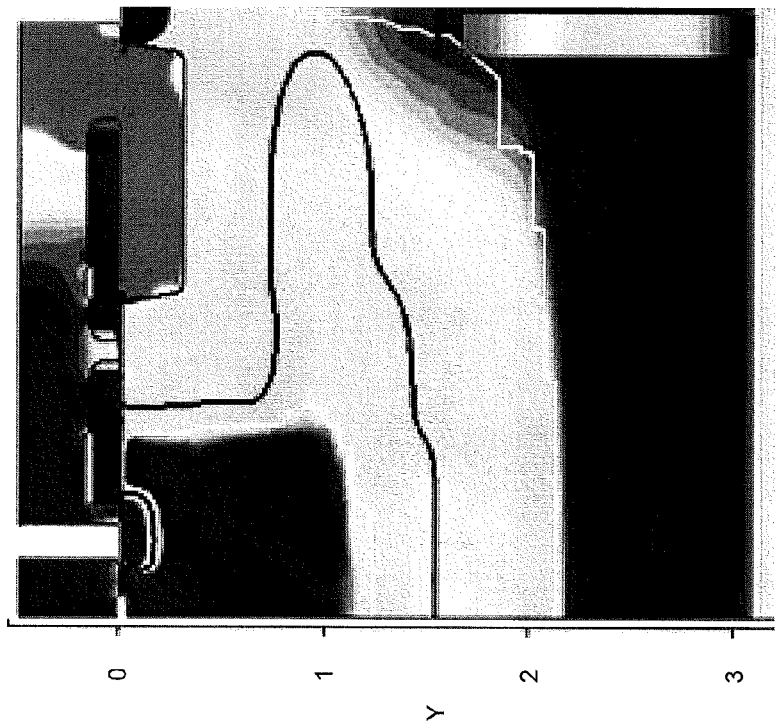
FIG. 5 includes a diagram illustrating example electric field distribution within an example high-side LDMOSFET.
Figure 4:
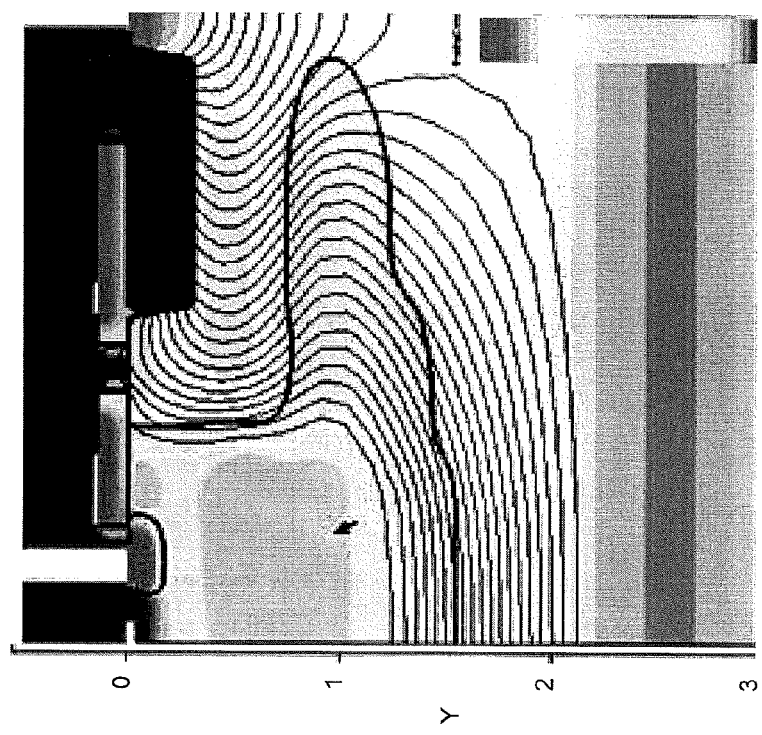
FIG. 4 includes a diagram illustrating example doping concentrations and potential distribution within an example high-side LDMOSFET.

FIG. 4 includes an example diagram illustrating example doping concentrations of the LDMOSFET 300 and potential distribution within the LDMOSFET 300. FIG. 5 includes an example diagram illustrating electric field distribution within the LDMOSFET 300.

While the present application will be discussed in terms of an LDMOSFET, the present application may be applicable to other types of diffused MOSFETs (DMOS). Also, while the present application will be discussed in terms of an n-type LDMOSFET, the present application may also be applicable to p-type MOSFETs. While an example dual gate implementation is shown and will be discussed, the present application is also applicable to single gate MOSFETs.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A laterally diffused metal oxide semiconductor field effect transistor (LDMOSFET) comprising:
   a first source contact region, a first gate contact region, and a drain contact region;
   an n-type buried layer;
   a first p-type body region formed in an n-type epitaxial layer, the first p-type body region directly contacting the first source contact region and extending past a first end of the first source contact region toward the drain contact region;
   a first p-type reduced surface field (PRSF) region formed in the n-type epitaxial layer, the PRSF region disposed between the first p-type body region and the n-type buried layer;
   an n-type drift region formed in the n-type epitaxial layer, the n-type drift region directly contacting the drain contact region,
   wherein the first PRSF region extends into an area between the n-type drift region and the n-type buried layer;
   a second source contact region and a second gate contact region;
   a second p-type body region formed in the n-type epitaxial layer, the second p-type body region directly contacting the second source contact region and extending past a second end of the second source contact region toward the drain contact region;
   a second PRSF region formed in the n-type epitaxial layer, the second PRSF region disposed between the second p-type body region and the n-type buried layer and extending into the area between the n-type drift region and the n-type buried layer; and
   an n-type diffusion region in the n-type epitaxial layer disposed in the area between the n-type buried layer and the n-type drift region and between the first and second PRSF regions, the n-type diffusion region electrically connecting the n-type buried layer with the n-type drift region between the first and second PRSF regions.

2. The LDMOSFET of claim 1 wherein the first PRSF region extends past a third end of the first p-type body region and toward the n-type drift region.

3. The LDMOSFET of claim 2 wherein the first PRSF region extends past the third end of the first p-type body region and past a fourth end of the n-type drift region.

4. The LDMOSFET of claim 1 wherein the first p-type body region is formed in the n-type epitaxial layer by at least one of ion implantation and diffusion.

5. The LDMOSFET of claim 4 wherein a doping concentration of the first p-type body region is between $1e^{17}$ and $5e^{18}$ ions per cubic centimeter, inclusive.

6. The LDMOSFET of claim 1 wherein the n-type buried layer is formed in the n-type epitaxial layer by at least one of ion implantation and diffusion.

7. The LDMOSFET of claim 6 wherein a doping concentration of the n-type buried layer is between $1e^{18}$ and $5e^{19}$ ions per cubic centimeter, inclusive.

8. The LDMOSFET of claim 1 wherein the first PRSF region is formed in the n-type epitaxial layer by at least one of ion implantation and diffusion.

9. The LDMOSFET of claim 8 wherein a doping concentration of the first PRSF region is between $5e^{15}$ and $5e^{16}$ ions per cubic centimeter, inclusive.

10. The LDMOSFET of claim 1 wherein the n-type drift region is formed in the n-type epitaxial layer by at least one of ion implantation and diffusion.

11. The LDMOSFET of claim 10 wherein a doping concentration of the n-type drift region is between $1e^{16}$ and $1e^{17}$ ions per cubic centimeter, inclusive.

12. The LDMOSFET of claim 1 wherein a doping concentration of the n-type epitaxial layer is between $1e^{15}$ and $2e^{16}$ ions per cubic centimeter, inclusive.

13. The LDMOSFET of claim 1 wherein a distance between a third end of the first p-type body region and a fourth end of the n-type buried layer is less than 5 microns.

14. The LDMOSFET of claim 1 wherein a distance between a third end of the first p-type body region and a fourth end of the n-type buried layer is less than 4 microns.

15. The LDMOSFET of claim 1 wherein a distance between a third end of the first p-type body region and a fourth end of the n-type buried layer is less than 3 microns.

16. The LDMOSFET of claim 1 wherein a distance a third an end of the first p-type body region and a fourth end of the n-type buried layer is less than 2.5 microns.

17. The LDMOSFET of claim 1 wherein the n-type diffusion region directly contacts the first PRSF region, the second PRSF region, the n-type buried layer, and the n-type drift region.

18. The LDMOSFET of claim 1 wherein the n-type diffusion region includes a first doping concentration, the n-type epitaxial layer includes a second doping concentration, and the first and second doping concentrations are different.

* * * * *

UNITED STATES PATENT AND TRADEMARK OFFICE
CERTIFICATE OF CORRECTION

| | | |
|---|---|---|
| PATENT NO. | : 9,196,680 B1 | Page 1 of 1 |
| APPLICATION NO. | : 14/312882 | |
| DATED | : November 24, 2015 | |
| INVENTOR(S) | : Vishnu Khemka et al. | |

It is certified that error appears in the above-identified patent and that said Letters Patent is hereby corrected as shown below:

In the Specification:

Column 1, Line 13  After "on", delete "the came day as this"

Column 4, Lines 17-18  Delete "NBL 236 less than 5 microns (um), less than 4 um, less than 3 um, less than 2.5 um, or approximately 2 um or less" and insert --NBL 236 less than 5 microns (μm), less than 4 μm, less than 3 μm, less than 2.5 μm, or approximately 2 μm or less--

Column 4, Line 26  Delete "um" and insert --μm--

Column 4, Lines 59-61  Delete "regions 320 less than 5 microns (urn), less than 4 urn, less than 3 urn, less than 2.5 um, or approximately 2 um or less in various implementations" and insert --regions 320 less than 5 microns (μm), less than 4 μm, less than 3 μm, less than 2.5 μm, or approximately 2 μm or less in various implementations.--

Signed and Sealed this
Fifteenth Day of March, 2016

Michelle K. Lee
*Director of the United States Patent and Trademark Office*